(12) United States Patent
Freitag et al.

(10) Patent No.: US 10,224,174 B1
(45) Date of Patent: Mar. 5, 2019

(54) TRANSMISSION CHARGED PARTICLE MICROSCOPE WITH IMAGING BEAM ROTATION

(71) Applicant: FEI Company, Hillsboro, OR (US)

(72) Inventors: Bert Henning Freitag, Eindhoven (NL); Peter Christiaan Tiemeijer, Eindhoven (NL); Maarten Bischoff, Uden (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/803,642

(22) Filed: Nov. 3, 2017

(51) Int. Cl.
    *H01J 37/147* (2006.01)
    *H01J 37/26* (2006.01)
    *H01J 37/10* (2006.01)

(52) U.S. Cl.
    CPC ............ *H01J 37/147* (2013.01); *H01J 37/10* (2013.01); *H01J 37/26* (2013.01)

(58) Field of Classification Search
    CPC ........... H01J 37/147; H01J 37/10; H01J 37/26
    USPC .................................. 250/306, 307, 310, 311
    See application file for complete search history.

(56) References Cited

U.S. PATENT DOCUMENTS

2002/0166963 A1   11/2002   Kondo
2014/0061464 A1*   3/2014   Lazic ................... H01J 37/153
                                                         250/307

OTHER PUBLICATIONS

Escovitz et al., "Scanning Transmission Ion Microscope with a Field Ion Source," *Proc. Nat. Acad. Sci. USA* 72(5), pp. 1826-1828 (May 1975).
Hawkes et al., "Principles of Electron Optics," *Academic Press*, London, vol. 1 (Feb. 11, 1989).
Midgley, "A simple new method to obtain high angular resolution ω-q patterns," *Ultramicroscopy*, 76:91-96 (Jan. 3, 1999).

* cited by examiner

*Primary Examiner* — Michael Maskell
(74) *Attorney, Agent, or Firm* — Klarquist Sparkman, LLP

(57) ABSTRACT

A method, includes, with an illumination system, directing a first charged particle beam along a particle-optical axis to a specimen position, with an imaging system, receiving a second charged particle beam from the specimen position and directing the second charged particle beam to a detector, recording a first output of the detector, varying an excitation of an optical element of the imaging system with a controller so as to rotate the second charged particle beam at the detector through a yaw angle about the particle-optical axis, and recording a second output of the detector at the yaw angle.

10 Claims, 4 Drawing Sheets

TRANSMISSION CHARGED PARTICLE MICROSCOPE WITH IMAGING BEAM ROTATION

FIELD

The field is charged particle microscopy.

BACKGROUND

Charged-particle microscopy is an increasingly important technique for imaging microscopic objects, particularly in the form of electron microscopy. Historically, the basic genus of electron microscope has undergone evolution into a number of apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g., a FIB-SEM), which additionally employ a "machining" Focused Ion Beam (FIB), allowing supportive activities such as ion-beam milling or Ion-Beam-Induced Deposition (IBID), for example. However, a need remains for improvements charged-particle microscopes and related devices.

SUMMARY

According to an aspect of the disclosed technology, methods include, using an illumination system, directing a first charged particle beam along a particle-optical axis to a specimen position, with an imaging system, receiving a second charged particle beam from the specimen position and directing the second charged particle beam to a detector, recording a first output of the detector, varying an excitation of an optical element of the imaging system with a controller so as to rotate the second charged particle beam at the detector through a yaw angle about the particle-optical axis, and recording a second output of the detector at the yaw angle.

According to another aspect of the disclosed technology, apparatus include a specimen holder situated to receive a specimen, a beam source situated to produce a charged particle beam, an illuminator situated to direct the charged particle beam along a particle-optical axis so as to irradiate a specimen held by the specimen holder, an imaging system situated to receive a charged particle flux transmitted through the specimen and to direct the charged particle flux to a sensing device, and a controller coupled to the imaging system and situated to record a first output of the sensing device, to alter an excitation of an optical element in the imaging system so as to rotate the charged particle flux through a yaw angle about the particle-optical axis, and record a second output of the sensing device at the yaw angle.

According to a further aspect of the disclosed technology, methods of analyzing a specimen in a transmission charged particle microscope, include providing the specimen on a specimen holder, producing a beam of charged particles from a source, directing the beam with an illuminator along a particle-optical axis so as to irradiate the specimen, receiving a flux of charged particles transmitted through the specimen with an imaging system and directing the flux of charged particles onto a sensing device, and with a controller, recording a first output of the sensing device, altering an excitation of an optical element in the imaging system so as to change a parameter P selected from the list comprising (a) rotational stance of image plane or diffraction plane, (b) focal plane position, (c) magnification, and (d) beam final cross-over position, and recording a second output of the sensing device at substantially the same values of the parameters of the list other than for the changed parameter P.

The foregoing and other objects, features, and advantages of the disclosed technology will become more apparent from the following detailed description, which proceeds with reference to the accompanying figures.

DETAILED DESCRIPTION

Figure 1:
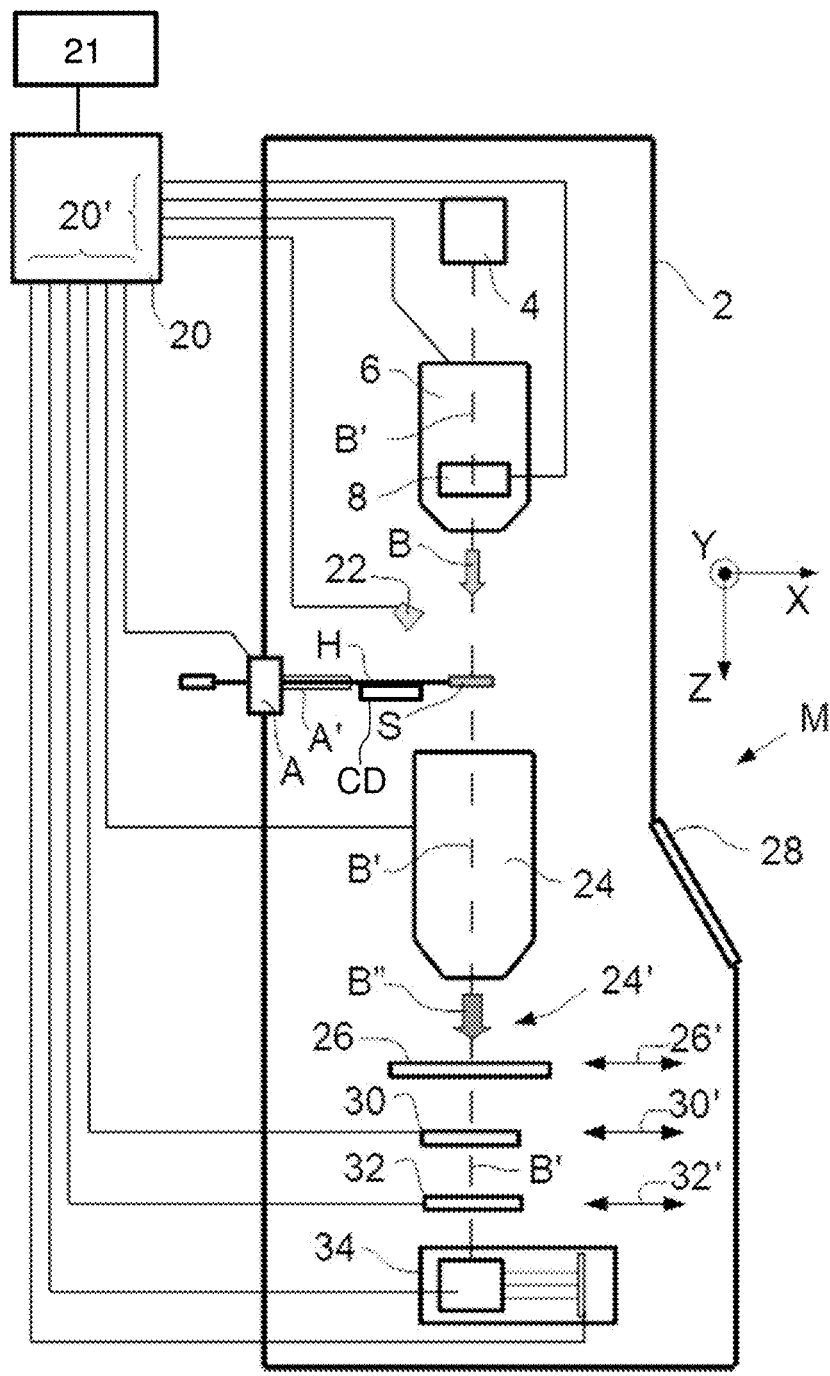
FIG. 1 renders a longitudinal cross-sectional elevation view of an embodiment of a TCPM in which examples of the disclosed technology can be implemented.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Particle beams and optical elements are described in some examples with respect to one or more axes. Typically, an axis includes one or more straight line segments along which a beam propagates or along which one or more optical elements are situated, such as particle lenses. Such axes can be bent or folded with lenses or other elements, so that axes need not be single straight line segments.

In an SEM, irradiation of a specimen by a scanning electron beam precipitates emanation of "auxiliary" radiation from the specimen, in the form of secondary electrons, backscattered electrons, X-rays, and cathodoluminescence (infrared, visible and/or ultraviolet photons), for example. One or more components of this emanating radiation is then detected and used for image accumulation or other purposes.

In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, "charged particle" can refer to electrons, positive ions (e.g., Ga or He ions), negative ions (such as oxygen), protons, and positrons, by way of example. As regards non-electron-based charged particle microscopy, can include focused ion beams, scanning helium ion microscopes, and scanning transmission ion microscopes (see e.g., H. Escovitz, T. R. Fox and R. Levi-Setti, *Scanning Transmission Ion Microscope with a Field Ion Source*, Proc. Nat. Acad. Sci. USA 72(5), pp. 1826-1828 (1975)).

In addition to imaging and performing localized surface modification (e.g., milling, etching, deposition, etc.), examples of charged particle microscopes herein can also have other functionalities, such as performing spectroscopy, examining diffractograms, studying ion channeling/ion backscattering (Rutherford Backscattering Spectrometry), etc.

In representative embodiments, a transmission charged particle microscope (TCPM) comprise a particle source, such as a Schottky electron source or ion source, and an illuminator system, such as a charged particle beam column, which serves to manipulate a "raw" radiation beam from the source and perform upon it optical operations such as focusing, aberration mitigation, cropping (e.g., with a diaphragm), filtering, etc. Illuminator systems generally comprise one or more (charged-particle) lenses, and may comprise other types of optical components. In some examples, the illuminator system can be provided with a deflector system that can be invoked to cause an exit beam to scan across the specimen being investigated. Representative TCPMs also include a specimen holder, on which a specimen under investigation can be held and positioned (e.g., tilted, rotated). In some examples, the specimen holder can be moved so as to effect scanning motion of the specimen with respect to the beam. In general, such a specimen holder will be connected to a positioning system. When intended to hold cryogenic specimens, the specimen holder can be provided with a suitable cooling device. Representative TCPMs further includes an imaging system, which can be situated to direct and focus charged particles that are transmitted through a specimen onto a sensing device, such as a detection/imaging device (camera), spectroscopic apparatus (such as an EELS module: EELS=Electron Energy-Loss Spectroscopy), detector, etc. As with examples of illuminator systems referred to above, examples of the imaging system may also perform other functions, such as aberration mitigation, cropping, filtering, etc., and it will generally comprise one or more charged-particle lenses and/or other types of particle-optical components.

Spectroscopic apparatus as referred to herein typically include a dispersing device (e.g., comprising one or more "charged-particle prisms") situated to disperse an incoming flux of charged particles from the imaging system into an energy-resolved continuous array of spectral sub-beams, which can be directed onto a detection surface so as to form a spectrum. In representative examples, incoming flux will contain charged particles of various energies, and the dispersing device will "fan these out" along one or more dispersion directions into a continuous collection/array of sub-beams of different energies in a manner somewhat similar to a mass spectrometer.

In some examples, employed sensing devices or detectors can be unitary or compound/distributed in nature, and can take various forms for different applications. In some examples, sensing devices comprise one or more photodiodes, CMOS detectors, CCD detectors, photovoltaic cells, etc.

In the description herein, examples of the disclosed technology may sometimes be described in the specific context of electron microscopy; however, such context is intended solely for clarity/illustrative purposes, and should not be interpreted as limiting.

An example of a TCPM as set forth above is a (S)TEM that is provided with an EELS module. Electron Energy-Loss Spectroscopy (EELS) is a technique used in (S)TEMs to obtain elemental/chemical information pertaining to a given specimen. A moving electron in an irradiating beam from the (S)TEM's illuminator system can transfer energy to a bound electron in a core shell of an atom in the specimen, and promote this core electron to an outer shell (e.g., via inelastic scattering). This energy transfer from the moving electron gives rise to a so-called "core-loss peak" (CLP) in the EELS spectrum. The coarse position in energy units of the CLP is element-specific, and its precise position and shape are specific to the element's chemical environment and bonding. In addition to the CLPs referred to above, an EELS spectrum will generally also contain so-called "Plasmon Resonance Peaks" (PRPs), i.e., a relatively broad series of peaks/shoulders associated with single or multiple scattering of electrons on plasmons in the specimen. These PRPs typically lie in the energy range 0-50 eV. Typically, EELS modules can also be used as energy-selective imaging devices (EFTEMs: Energy-Filtered TEMs). To achieve this, they employ a slit ("letterbox") at/proximal their primary spectrum plane. When the module is used as a pure spectrometer, this slit is retracted, and the spectrum plane can be magnified and imaged onto the employed detector (e.g., camera) using post-dispersion optics. In some examples, the module can be used as an energy-selective imaging device, and the slit can be invoked to pass/admit only a specific energy window, typically of the order of 10-50 eV wide); in that case, the post-dispersion (post-slit) optics can image a Fourier Transform plane of the spectrum plane onto the detector.

In addition to performing spectroscopy, a (S)TEM can also be used to investigate diffractograms of (crystalline) specimens. To this end, a sensing device, such as a camera, can be located in a diffraction plane of the imaging system and can be used to detect a diffraction pattern (generally comprising a geometric array of bright spots) carried by the electron flux that traverses the specimen.

Various direction-dependent analysis techniques to be performed in a (S)TEM (or other TCPM) can require a specific orientation (e.g., yaw, i.e., rotation about Z, $R_Z$) of a detection surface of the sensing device relative to the specimen. For example, orientations may be required in the investigation of radiation propagation along different crystallographic axes of a specimen, or in the analysis of momentum-dependent plasmon scattering using EELS. See, for example, the article by P.A. Midgley, "A simple new method to obtain high angular resolution ω-q patterns", Ultramicroscopy 76 (1999), pp. 91-96 (Elsevier publ.). Such yaw orientation adjustment can be attempted by rotating specimen holder and/or a sensing device so that an optimum sensing direction can be configured. However, specimen holders in TCPMs typically have a limited yaw functionality, and modifying a specimen holder to provide greater yaw adjustability generally increases bulk/complexity in a location between illuminator and imaging system that is typically already highly spatially constrained. Furthermore, it is typically impractical to rotate certain types of sensing devices. For example, an EELS module can be of the order of 50 cm long in a direction normal to the CPM's particle optical axis, and a yaw about the axis would present substantial difficulties and/or complexities. Moreover, both of these approaches introduce the risk of causing unintended/undesired displacement in addition to intended/desired rotation, e.g., due to play/hysteresis in the employed mechanical rotation mechanisms. In representative embodiments of the disclosed technology, alternative rotation techniques are provided for conducting direction-dependent specimen analysis in a TCPM.

In some examples, a first output of a sensing device is recorded, an excitation of an optical element or multiple elements in the imaging system is altered so as to rotate a flux through a yaw angle about an optical axis, and a second output of the sensing device is recorded at the new yaw angle. As an alternative to specimen or detector rotation, examples of the disclosed technology can rotate the charged particle flux propagating between a specimen and sensing device, e.g., by rotating (or yawing) an image falling upon a camera, or by rotating the electron flux entering an EELS module, etc. In representative examples, at least four inter-related optical factors of an imaging system that mutually affect one another are adjusted, including:

(a) Rotational stance of image plane/diffraction plane;
(b) Focus [focal plane position/focal length];
(c) Magnification;
(d) Beam final cross-over position.

In order to allow factor (a) to be adjusted without undesirable changes to factors (b)-(d), the imaging system can be reconfigured based on a selected value of (a). In some examples herein, a rigorous and highly-accurate method of autonomously achieving such adjustments (on-the-fly) is performed, using a controller (e.g., processor/computer) that is programmed with a lens matrix for each lens in the imaging system, one or more transfer matrices for calculating a combined lens effect of the lens matrices, a root-finding algorithm (such as a Newton-Raphson algorithm) that employs the matrices to iterate to the magnification, focus, and beam final cross-over values for a selected yaw angle. Such a numerical solving algorithm can be multi-dimensional, or formulated in terms of a series of one-dimensional optimization problems, by way of example.

A controller programmed in this way provides the microscope user with a real-time/live response, whereby the user experiences image (or diffraction pattern/spectral) orientation as being directly connected to a (virtual) "rotation knob" on the user interface (in typical examples herein, algorithms performing a parameter set calculation/optimization can be completed in milliseconds). As a "free side effect", examples herein can also provide continuous image (or diffraction pattern/spectral) magnification—which contrasts strongly with the limited number of discrete magnification settings traditionally available in a (S)TEM. Both of these effects can greatly help to optimize detection efficiency. Possible displacement/shift effects caused by changes in lens excitation can be addressed by modeling the mechanical tilt of the lens(es) in question, and calculating/applying a compensatory counter-displacement so as to produce (on-the-fly) cancellation of these effects.

For the final cross-over position (which is related to Back Focal Plane position), in the case of EELS studies, for example, a transverse/lateral shift in final cross-over position can result in an associated transverse shift in a measured spectrum, and a corresponding energy error, and a longitudinal shift will generally result in a focus error. Therefore, in representative examples, transverse and/or longitudinal shifts in final cross-over position are maintained within tight constraints.

Various examples of the disclosed technology can provide free rotation of the image, diffraction pattern, and/or spectral input in a TCPM, and can be exploited to boost the performance and yield of many applications, allowing for new results. In some examples, the flexibility of rotating the image/diffraction plane freely and without an involuntary change in magnification can allow performance improvement for detectors in various applications. In particular examples, it allows for momentum-resolved EELS applications on any specimen area and for any orientation of the material examined. By way of illustration, several exemplary applications can benefit from the disclosed technology.

For example, ω-q measurements in EELS can require bringing different scattering directions (k-vectors) perpendicular to the fixed energy (E) axis of the spectrometer. By rotating the diffraction plane, different k/E planes can be quickly and reliably sampled on the same specimen. In some examples, by rotating the diffraction pattern, a 3D k-vector energy diagram can be obtained, easily allowing the complete Brillouin zone of the specimen material to be measured (with low-energy-loss EELS).

Also, in traditional segmented STEM imaging, the detector segments and the specimen orientation have a fixed relationship, meaning that the shift of a particular diffraction pattern to be measured on the segments can be non-optimum, particularly when moving along or close to the edge of the segments. This leads to smaller signal differences when subtracting different segment outputs for DPC (Differential Phase Contrast) applications. Thus, in some examples herein, by rotating the diffraction pattern, this signal can be maximized, so as to minimize the detector noise/boost the Signal-to-Noise ratio (thereby allowing lower fields to be measured).

In some examples of the disclosed technology, rotation of the image plane allows an area of interest on the specimen to be optimally matched to the squared dimensions of the camera in TEM imaging. The ability to do this without undesired changes in magnification/focus allows standardized analysis of the image, so that the feature of interest can be always oriented in the same way. This can enable more statistically meaningful analysis of repetitive measurements, and a higher measurement accuracy.

In further examples, rotating the image concurrently rotates a tilt axis (relative to the camera) for TEM tomography studies. This allows FoV (Field of View) to be maximized for tomography applications in TEM, e.g., by orienting the tilt axis perpendicular to an edge of the camera FoV.

It should be noted that the calculations referred to above do not necessarily have to be performed "on-the-fly". Instead, if so desired, one can pre-perform a multiplicity (e.g., several hundred) of such calculations—for different lens parameters or combinations of lens parameters in a given imaging system design—and pre-store them in a memory, such as a look-up table, for later consultation or use. This saves real-time calculation overhead, while still providing (quasi-)real-time responsiveness to user-input rotation (yaw) values. For example, a yaw angle can be selected by a user, and after accessing predetermined lens parameter values in a look-up table, lens parameter corrections can be applied with the controller to produce the selected yaw angle.

Embodiment 1

FIG. 1 is a side-view schematic depiction of an embodiment of a TCPM according to some examples of the disclosed technology; more specifically, it shows an embodiment of a TEM/STEM. In further examples, the depiction can correspond to an ion-based microscope. In FIG. 1, within a vacuum enclosure 2, an electron source 4 produces a beam B of electrons that propagates along an electron-optical axis B' and traverses an electron-optical illuminator system (charged particle beam column) 6, serving to direct/focus the electrons onto a selected part of a specimen S (which may, for example, be locally thinned/planarized). Also depicted is a deflector 8, which can be used to scan the beam B.

The specimen S is held on a specimen holder H that can be positioned in various orientations with multiple degrees of freedom by a positioning device/stage A. For example, the stage A can move a cradle A' into which holder H can be affixed or removably affixed. In some examples, the specimen holder H may comprise a finger that can be moved in the XY plane. In further examples, motion parallel to Z and tilt about X/Y is also possible. Such movement allows different parts of the specimen S to be illuminated/imaged/inspected by the electron beam B traveling along axis B' in the Z direction, and/or allows scanning motion to be performed as an alternative to beam scanning. In some examples, a cooling device CD can be brought into thermal contact with the specimen holder H, so as to maintain the specimen holder H and the specimen S at cryogenic temperatures.

The electron beam B interacts with the specimen S in such a manner as to cause various types of radiation to emanate from the specimen S, including, by way of example, secondary electrons, backscattered electrons, X-rays, and optical radiation (e.g., cathodoluminescence). In typical examples, one or more of these radiation types can be detected with the analysis device 22, which can include a combined scintillator/photomultiplier, EDX (Energy-Dispersive X-Ray Spectroscopy) module, or other detector. In some examples, an image can be constructed using the same or similar principles as in an SEM. In representative embodiments, electrons that traverse (pass through) the specimen S are examined. The traversed electrons exit/emanate from the specimen and continue to propagate, typically with at least a portion that are deflected and/or scattered, along axis B'. Such a transmitted electron flux enters an imaging system 24 (such as a projection lens), which will generally comprise a variety of electrostatic/magnetic lenses, deflectors, correctors (such as stigmators), etc. In a normal non-scanning TEM mode, this imaging system 24 can focus the transmitted electron flux onto a fluorescent screen or sensing device 26, which, if desired, can be retracted/withdrawn, as schematically indicated by arrows 26', so as to position the sensing device 26 away from axis B'. An image or diffractogram of at least part of the specimen S can be formed by imaging system 24 on screen 26, and this may be viewed through viewing port 28 located in a suitable part of a wall of enclosure 2. The retraction mechanism for screen 26 may, for example, be mechanical and/or electrical actuator.

In addition to, or instead of, viewing an image, such as a diffractogram, on screen 26, a large depth of focus (e.g., of the order of 1 meter) of the electron flux leaving imaging system 24 can be used for additional image capture or processing. For example, various other types of sensing devices or detectors can be used. In an embodiment, a TEM camera 30 is situated downstream from the screen 26 along the axis B'. At camera 30, electron flux B" can form a static image or diffractogram that can be processed by controller/processor 20 and displayed on a display device 21, such as a flat panel display, for example. In some examples, camera 30 can be retracted/withdrawn (as schematically indicated by arrows 30') so as to be spaced apart from axis B' and not obstruct electron flux B".

In further examples, a STEM camera 32 can be situated along the axis B'. An output from camera 32 can be recorded as a function of (X,Y) scanning position of the beam B on the specimen S, and an image can be constructed that is a "map" of output from camera 32 as a function of (X,Y). In some examples, camera 32 can comprise a single pixel with a diameter of e.g., 20 mm, and the camera 30 can include a matrix of pixels. In additional examples, camera 32 has a substantially higher acquisition rate (e.g., $10^6$ points per second) than camera 30 (e.g., $10^2$ images per second). In selected examples, camera 32 can be retracted/withdrawn (as schematically indicated by arrows 32') so as to be spaced apart from axis B'. In further examples, the camera 32 is a donut-shaped annular dark field camera that includes a central hole that allows flux passage. In some dark-field camera examples, the camera 32 need not be retracted/withdrawn when not in use as flux can propagate through the central hole to a subsequent camera, detector, or other optical component. In additional embodiments, including in some examples as an alternative to imaging with cameras 30 or 32, a spectroscopic apparatus 34 can be situated to receive electron flux. In particular examples, the spectroscopic apparatus includes an EELS module. It should be noted that the order/location of items 30, 32 and 34 can be varied as convenient. In an embodiment, spectroscopic apparatus 34 is integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on the display device 21. In some examples, the controller 20 may be (partially) inside or outside the enclosure 2, and may have a unitary or composite structure, as convenient.

In some examples, the interior of the enclosure 2 is not kept at a strict vacuum; for example, in a so-called "Environmental TEM/STEM", a background atmosphere of a selected gas is introduced/maintained within the enclosure 2. In further examples, the volume of enclosure 2 can be confined so that, where possible, it is in close proximity to the axis B', such as by taking the form of a small tube (e.g., of the order of 1 cm in diameter) through which the employed electron beam passes, but one or more increased diameters to accommodate structures such as the source 4, specimen holder H, screen 26, camera 30, camera 32, spectroscopic apparatus 34, etc.

Figure 2:
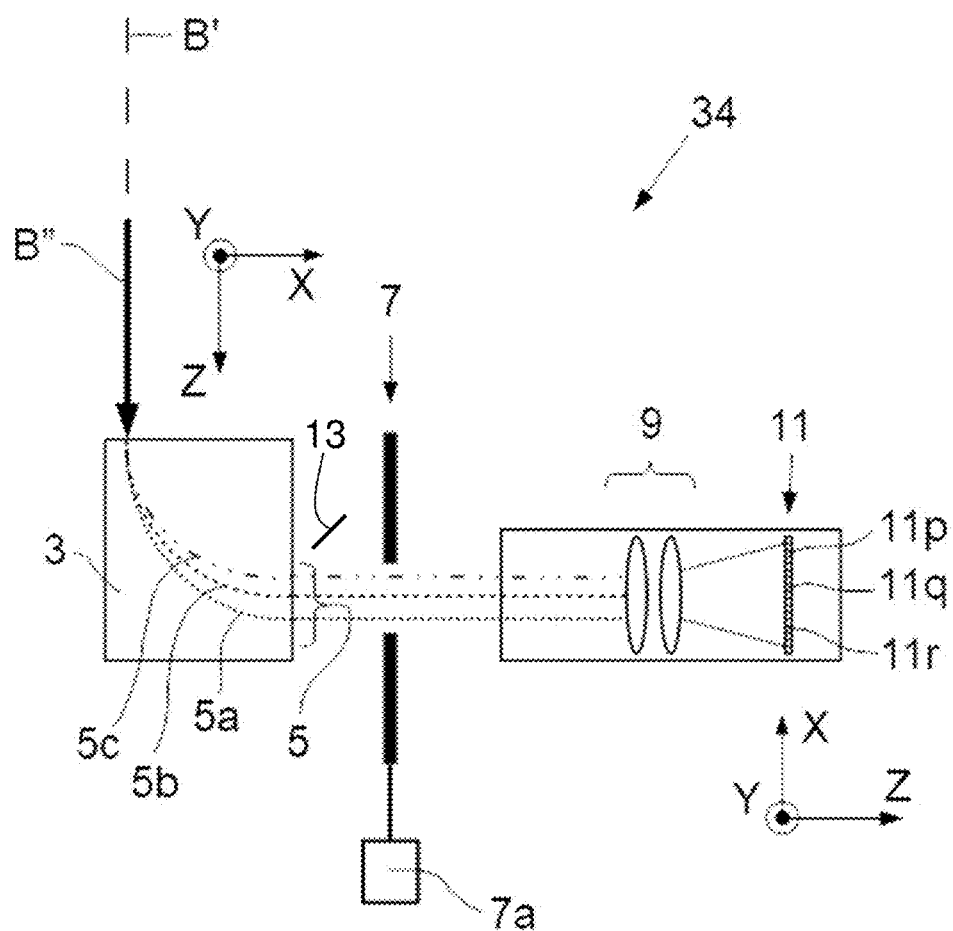
FIG. 2 shows an enlarged and more detailed view of part of FIG. 1, including an example of an electron energy-loss spectroscopy (EELS) module.

FIG. 2 shows an enlarged and more detailed view of the spectroscopic apparatus 34 in FIG. 1. In FIG. 2, flux B" of electrons (which has passed through specimen S and imaging system 24) is shown propagating along electron-optical axis B'. The flux B" enters a dispersing device 3, such as an electron prism, where it is dispersed (fanned out) into an energy-resolved/energy-differentiated (continuous) array 5 of spectral sub-beams (schematically indicated in FIG. 2 using broken lines), which are distributed along dispersion direction X. For illustration purposes, three of these sub-beams are labelled 5a, 5b and 5c in FIG. 2. As shown, propagation occurs along the Z direction, and the depicted Cartesian coordinate system co-deflects with the flux B" within the dispersing device 3. The angle change of the Z-axis based on the deflection is shown as a right angle, though other angles are possible.

Downstream from the dispersing device 3, the array 5 of sub-beams 5a-5c encounters an adjustable/retractable slit (letterbox) 7, which can, for example, be used in EFTEM-mode to select/admit a given portion of the array 5 and to discard/occlude other portions thereof. In some examples, the slit 7 is connected to an actuation device 7a that can be invoked to open, close, and/or move the opening in the slit 7 as desired. In EELS mode, this slit 7 is typically fully open/retracted. In typical examples, the slit 7 is advantageously disposed at a location at or proximal to a dispersion plane of the spectroscopic apparatus 34. In some examples, the detector 11 is also similarly advantageously located at or proximal to such a plane. In further examples, the array 5 of spectral sub-beams falling upon the slit 7 can be aimed or shifted by adjusting, for example, an electrical signal to the dispersing device 3 and/or a drift tube/deflector 13 provided between the dispersing device 3 and slit 7, by way of example.

After having traversed slit 7, the selected portion of the array 5 passes through post-dispersion electron optics 9, where it is magnified/focused, for example, and directed/projected onto detector 11, with sub-beams 5a, 5b, 5c respectively impinging upon detector portions 11p, 11q, 11r.

In accordance with the some examples of the disclosed technology, the electron flux B" in image space 24' of imaging system 24 (e.g., as seen in FIG. 1) can be rotated/yawed about the Z-axis by appropriately adjusting the excitation of at least one optical element, such as a magnetic lens element, in imaging system 24. As discussed above—and as set forth in more detail below—such adjustment can be accompanied by a variation of lens parameters in imaging system 24, so as to maintain substantially constant values for parameters (b), (c) and (d) above. In different examples, substantially constant values can include parameter values that are within ±10%, ±1%, ±0.1%, or ±0.01% of selected parameter values.

Embodiment 2

Figure 3:
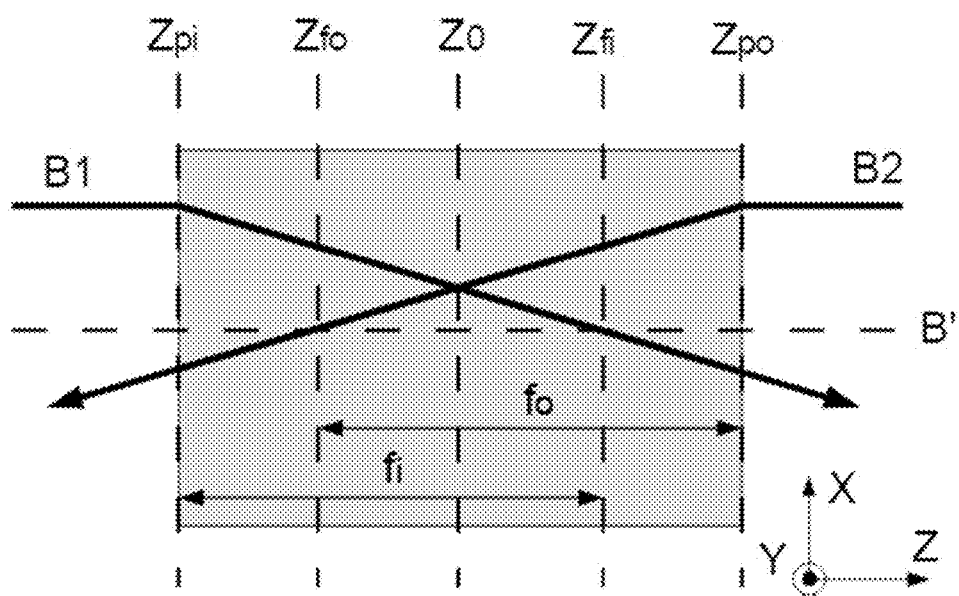
FIG. 3 shows various parameters that can be used to describe first-order particle-optical effects of a thick magnetic lens.

FIG. 3 schematically depicts electron rays B1, B2 and an optical axis B' that is rotated through 90° relative to axis B' shown in FIG. 1. As shown, various parameters are defined that can be used to provide a first-order description of a thick magnetic lens. The electron ray B1 that enters the lens from the left side (forward direction) parallel to the optical axis B' is refracted at the principal plane Zpi and crosses the optical axis B' at focal plane Zfi. The distance between Zpi and Zfi is defined as the focal length fi. The electron ray B2 that enters the lens parallel to the optical axis B' from the right side of the lens (backward direction) is refracted at the principal plane Zpo and crosses the optical axis B' at focal plane Zfo. If the potential is constant along the optical axis B', then fo=fi. In FIG. 3, Z0 denotes the geometric center of the thick lens.

The lens action between the two principal planes Zpi and Zpo can be described by the following matrix equation:

$$\begin{pmatrix} x(z = Zpi) \\ x'(x = Zpi) \end{pmatrix} = \begin{pmatrix} 1 & 0 \\ -1/fi & 1 \end{pmatrix} \cdot \begin{pmatrix} x(z = Zpo) \\ z'(z = Zpo) \end{pmatrix} \quad [1]$$

in which x and x' respectively denote the distance of a ray to the optical axis B' and the angle between the ray and the optical axis B'. Note that this equation describes the lens action from the object principal plane to the image principal plane of the lens, i.e., a ray coming from the left side of the lens in FIG. 3 moves to the Zpo plane first, where it virtually enters the lens, and virtually exits the lens at the Zpi plane, with unit magnification and an angle that is refracted by −x/fi. In three dimensions, the vector (x, x') can be replaced by the complex vector (u,u')=(x+iy, x'+iy') (where i denotes $\sqrt{-1}$). Furthermore, magnetic lenses also rotate the electron ray vector by an angle θ. This rotation depends on the lens excitation NI (N=number of coil turns; I=coil current) and the relativistic corrected energy U* via:

$$\theta = \mu_0 \sqrt{(e/8m)} NI/\sqrt{U^*} = 0.186 NI/\sqrt{U^*}$$

and can be included in the matrix formalism [1] by multiplying the lens matrix by a complex factor exp(i θ). The e and m, respectively, denote the electron charge and mass, and $\mu_0$ is the permeability of vacuum.

With a plurality of lenses positioned in series—thus forming a compound lens/imaging system—it can be convenient to describe the lens action by a matrix that operates at the geometrical center of the lens. Starting from Z0, a ray first moves to the Zpo plane, then the lens action described by equation [1] occurs, after which the ray moves back from Zpi to the geometrical center of the lens—which can be described by:

$$\begin{pmatrix} u_{out} \\ u'_{out} \end{pmatrix} = e^{i\vartheta} \cdot \begin{pmatrix} 1 & -Zpi \\ 0 & 1 \end{pmatrix} \cdot \begin{pmatrix} 1 & 0 \\ -1/fi & 1 \end{pmatrix} \cdot \begin{pmatrix} 1 & Zpo \\ 0 & 1 \end{pmatrix} \cdot \begin{pmatrix} u_{in} \\ u'_{in} \end{pmatrix} = L \cdot \begin{pmatrix} u_{in} \\ u'_{in} \end{pmatrix} \quad [2]$$

Furthermore, use is made of a drift matrix:

$$\Delta = \begin{pmatrix} 1 & d \\ 0 & 1 \end{pmatrix}$$

which does not change the angle u' of a ray vector, but changes u to u+d·u' (drift over distance d). For a system of n lenses, one can now write:

$$\begin{pmatrix} u_{image} \\ u'_{image} \end{pmatrix} = $$
$$\Delta(L_n \to \text{image}) \cdot L_n \cdot \ldots \cdot \Delta(L_1 \to L_2) \cdot L_1 \cdot \Delta(\text{object} \to L_1) \cdot \begin{pmatrix} u_{object} \\ u'_{object} \end{pmatrix} \quad [3]$$

in which the $\Delta$ terms are drift matrices (see above) and the L terms are lens matrices (see equation [2]). By inverting the total system matrix, a calculation can be performed from image plane to object plane. Calculations for focusing the lens series can be more accurate in the backward direction because the magnification M of imaging/projection systems is typically much larger than 1, and therefore the depth of focus is much smaller at the object plane than at the image plane.

The optical properties of a given lens system can be calculated by solving equation [3]. In some examples, software can be used that employs a root-finding algorithm (such as a Newton-Raphson algorithm). Examples of commercially available software packages, such as MLD or EOD by Lencova, can be used to calculate and determine the cardinal planes Zpi, Zpo, Zfi, Zfo in the discussion above.

Algorithms may be, for example, embodied as software or firmware instructions carried out by a controller, such as a digital computing device. For instance, any of the disclosed yaw angle rotation calculations can be performed by a computer or other computing hardware (e.g., an ASIC, FPGA, CPLD, etc.) that is part of a TCPM control system. The TCPM control system can be connected to or otherwise in communication with the imaging system (e.g., the lenses) and be programmed or configured to receive imaging data from the sensing device(s) or user control inputs and perform the desired image rotation computations or look-up table accesses (e.g., any of the lens parameter variation techniques disclosed herein). The controller can be a computer system comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed image rotation techniques. The results of the computations can be stored (e.g., in a suitable data structure or look-up table) in the one or more tangible, non-transitory computer-readable storage media and/or can also be output to the user, for example, by displaying, on a display device, with a graphical user interface. In particular examples, specimen images at various selected rotations are displayed on a display device.

Embodiment 3

Figure 4:
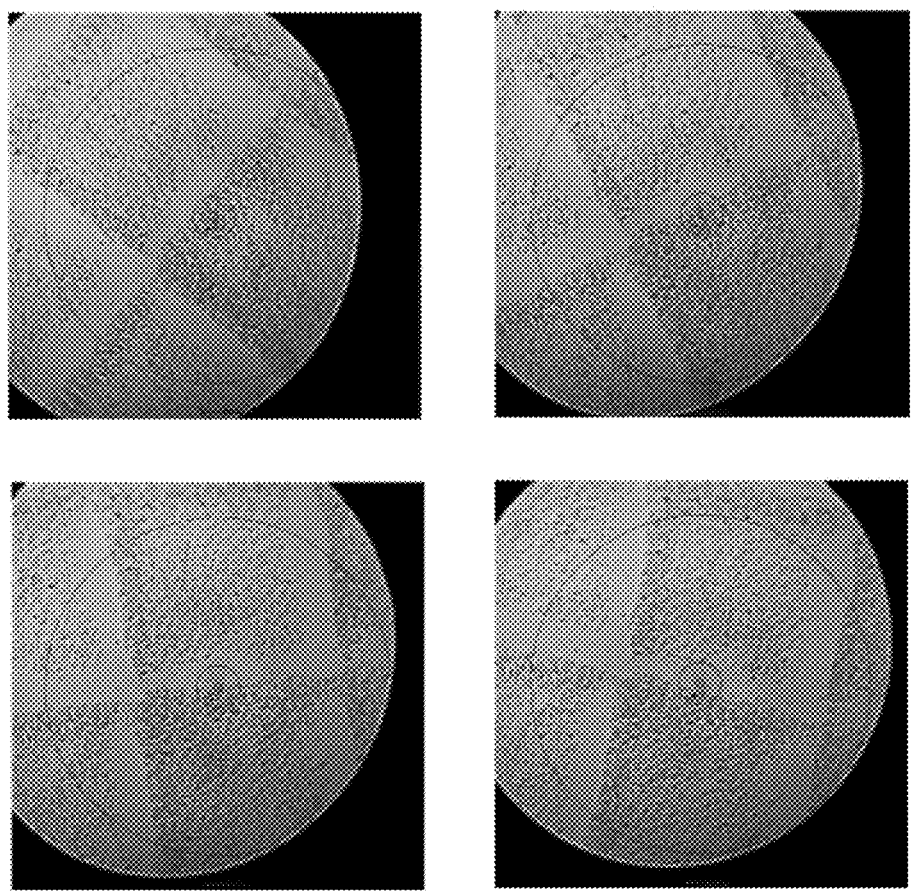
FIG. 4 shows TEM images of a particular specimen at four different rotation/yaw values, obtained with an example of the disclosed technology.

FIG. 4 shows TEM images of a particular specimen at four different rotation/yaw values, obtained using an example of the disclosed technology that rotated electron flux between the specimen and a detector with an imaging system. The specimen comprised a carbon substrate onto which gold particles had been deposited in a square pattern, each square being approximately 450 nm×450 nm. As can be seen from the different TEM images, even with different rotational stances in the four images, the magnification of the specimen in each image remains the same, and all images are in focus. Also, there is minimal translational drift between the four images. A maximum drift relative to the circular reference pattern is of the order of approximately 50 nm—which is orders of magnitude smaller than a drift typically introduced by image rotation through rotation of the specimen holder, for example.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. A method, comprising:
using an illumination system, directing a first charged particle beam along a particle-optical axis to a specimen position;
with an imaging system, receiving a second charged particle beam from the specimen position and directing the second charged particle beam to a detector;
recording a first output of the detector;
varying an excitation of an optical element of the imaging system with a controller so as to rotate the second charged particle beam at the detector through a yaw angle about the particle-optical axis; and
recording a second output of the detector at the yaw angle.

2. The method of claim 1, wherein the recorded first and second outputs correspond to substantially constant parameters of magnification, focus, and beam final cross-over position of the imaging system.

3. The method of claim 2, wherein the optical element includes a plurality of lens elements and the controller includes at least one processor and one or more computer-readable storage media including stored instructions, that, responsive to execution by the at least one processor, cause the controller to vary the excitation of the optical element based on a lens matrix for each of the lens elements, one or more transfer matrices for calculating a combined lens effect of the lens matrices, and a root-finding algorithm that uses the lens matrices and transfer matrices to iterate to the magnification, focus, and beam final cross-over values for the yaw angle.

4. The method of claim 1, wherein the detector is situated to produce at least one of an image, diffractogram, and spectrum.

5. The method of claim 2, wherein the detector is situated to produce at least one of an image, diffractogram, and spectrum.

6. The method of claim 3, wherein the detector is situated to produce at least one of an image, diffractogram, and spectrum.

7. An apparatus, comprising:
a specimen holder situated to receive a specimen;
a beam source situated to produce a charged particle beam;

an illuminator situated to direct the charged particle beam along a particle-optical axis so as to irradiate a specimen held by the specimen holder;

an imaging system situated to receive a charged particle flux transmitted through the specimen and to direct the charged particle flux to a sensing device; and a controller coupled to the imaging system and situated to record a first output of the sensing device, to alter an excitation of an optical element in the imaging system so as to rotate the charged particle flux through a yaw angle about the particle-optical axis, and record a second output of the sensing device at the yaw angle.

8. The apparatus of claim 7, wherein the apparatus is a transmission charged particle microscope.

9. A method of analyzing a specimen in a transmission charged particle microscope, comprising:

providing the specimen on a specimen holder;

producing a beam of charged particles from a source;

directing the beam with an illuminator along a particle-optical axis so as to irradiate the specimen;

receiving a flux of charged particles transmitted through the specimen with an imaging system and directing the flux of charged particles onto a sensing device; and with a controller, recording a first output of the sensing device, altering an excitation of an optical element in the imaging system so as to change a parameter P selected from the list comprising (a) rotational stance of image plane or diffraction plane, (b) focal plane position, (c) magnification, and (d) beam final cross-over position and so as to maintain substantially constant the other parameters of the list, and recording a second output of the sensing device at the changed parameter P with the other parameters maintained substantially constant.

10. The method of claim 9, wherein the parameter P is the (a) rotational stance of the image plane or diffraction plane.

* * * * *